United States Patent
Gauthier et al.

(10) Patent No.: US 6,791,360 B2
(45) Date of Patent: Sep. 14, 2004

(54) SOURCE SYNCHRONOUS INTERFACE USING VARIABLE DIGITAL DATA DELAY LINES

(75) Inventors: Claude R. Gauthier, Cupertino, CA (US); Brian W. Amick, Austin, TX (US); Aninda Roy, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 19 days.

(21) Appl. No.: 10/241,202

(22) Filed: Sep. 11, 2002

(65) Prior Publication Data

US 2004/0046589 A1 Mar. 11, 2004

(51) Int. Cl.$^7$ .................. H03K 19/00; H03K 19/096
(52) U.S. Cl. ................... 326/93; 326/96; 327/149
(58) Field of Search ................... 326/93, 95–96; 327/158, 149, 276–277

(56) References Cited

U.S. PATENT DOCUMENTS

| | | | | |
|---|---|---|---|---|
| 5,636,254 | A | | 6/1997 | Hase et al. .................. 375/371 |
| 6,333,657 | B1 | * | 12/2001 | Okajima ..................... 327/277 |
| 6,373,313 | B1 | * | 4/2002 | Hishiyama .................. 327/276 |
| 6,549,041 | B2 | * | 4/2003 | Waldrop ........................ 327/5 |

OTHER PUBLICATIONS

PCT International Search Report for PCT/US 03/24635 dated Nov. 28, 2003 (3 pages).
"A Semidigital Dual Delay–Locked Loop" as published in the IEEE Journal of Solid–State Circuits vol. 32, No. 11 (5 pages) Authors: Stefanos Sidiropoulos and Mark A. Horowitz Manuscript submitted Apr. 10, 1997; Revised Jun. 5, 1997.
"A Semidigital Dual Delay–Locked Loop"; by Stefanos Sidiropoulos and Mark A. Horowitz, IEEE Journal of Solid–State Circuits, vol. 32, No. 11, Nov. 1997 (10 pages).

* cited by examiner

Primary Examiner—James H. Cho
(74) Attorney, Agent, or Firm—Osha & May L.L.P.

(57) ABSTRACT

A source synchronous interface determines an amount of delay for an incoming data signal and a phase offset for a latch device that latches the incoming data signal. A delay locked loop may be a dual loop delay locked loop, in which case, the loops may use a low jitter, local clock signal and an input clock signal that was transmitted with the data signal. The low jitter, local clock signal may provide a stable source from which to derive good clock signal edge transitions. The input clock signal may be used to determine the long term clock signal drift. A finite state machine within the dual loop delay locked loop may provide the necessary information for the amount of delay and the phase offset. The delay of the incoming data signal is produced by a digital delay line.

25 Claims, 4 Drawing Sheets

SOURCE SYNCHRONOUS INTERFACE USING VARIABLE DIGITAL DATA DELAY LINES

BACKGROUND OF THE INVENTION

As the frequencies of modern computers continue to increase, the need to rapidly transmit data between chip interfaces also increases. To accurately receive data, source synchronous transmission may be used in which a clock signal is transmitted to help recover the data. The clock signal determines when the data signal should be sampled by a receiver's circuits.

The clock signal may transition at the beginning of the time the data signal is valid. The receiver often requires, however, that the clock signal transition during the middle of the time that the data signal is valid. Also, the transmission of the clock signal may degrade as it travels from its transmission source. In both circumstances, a delay locked loop, or DLL, can regenerate a copy of the clock signal at a fixed phase offset from the original clock signal.

A DLL must generate a copy of the clock signal with a known phase offset relative to the clock signal input into the DLL. A single cycle of a clock signal is considered to occur over 360 degrees. By specifying a phase offset, the same relative temporal delay is specified; however, the absolute amount of temporal delay may be different. For example, a 100 MHz clock signal has a 10 ns cycle time; therefore, a phase offset of 360 degrees would indicate that an entire cycle, or 10 ns, of delay has been added. A ninety degree phase offset is 2.5 ns (i.e., one fourth of the entire cycle). A 200 MHz clock signal has a cycle time of 5 ns. A ninety degree phase offset in this case is only 1.25 ns. The phase offsets in these examples are the same; however, the temporal delays are not.

FIG. 1 shows a typical source synchronous communication system (100). Data signals that are "K" bits wide are transmitted from circuit A (12) to circuit B (34) on a data path (14). To aid in the recovery of the transmitted data signals, a clock signal is transmitted on a clock path (16) at a similar time as the data signal. Although not shown, the communication system (100) could also have a path to transmit data signals from circuit B (34) to circuit A (12) along with an additional clock signal (not shown).

In FIG. 1, a DLL (40) generates a copy of the clock signal on the clock path (16) with a valid state and with a phase offset to be used by other circuits. For example, the DLL (40) outputs the copy of the clock signal with a predetermined phase offset to cause a latch device to sample the data signal. A latch device may be, for example, a flip-flop (38) as shown in FIG. 1. When the copy of the clock signal transitions, the flip-flop (38) samples the output of an amplifier (36) that amplifies the data signal on the data path (14). The latched signal from the flip-flop (38) is provided to other circuits on circuit B (34) as a local data signal (42).

The DLL (40) is arranged to maintain a constant phase offset between the clock signal input to the DLL (40) and the clock signal output from the DLL (40). The clock signal input to the DLL (40) may jitter. In other words, the clock signal may transition at relative intervals that are not equally spaced in time. Jitter in the transmitted clock signal degrades the performance of the source synchronous communication system (100).

SUMMARY OF THE INVENTION

According to one aspect of the present invention, a communication system comprises a first clock path arranged to carry a clock signal; a second clock path arranged to carry a local clock signal; a data path arranged to carry a data signal; a digital delay line arranged to delay the data signal to produce a delayed data signal; and a delay locked loop arranged to operatively control the delay of the digital delay line dependent on the clock signal and the local clock signal.

According to one aspect, a method for performing source synchronous interface operations comprises transmitting a clock signal; transmitting a local clock signal; transmitting a data signal; delaying the data signal using a digital delay line to produce a delayed data signal; and controlling the delaying dependent on the clock signal and the local clock signal.

According to one aspect, a communication system comprises means for transmitting a clock signal; means for transmitting a local clock signal; means for transmitting a data signal; means for delaying the data signal to produce a delayed data signal; means for controlling the delaying dependent on the clock signal and the local clock signal; and means for periodically updating the means for delaying.

Other aspects and advantages of the invention will be apparent from the following description and the appended claims.

DETAILED DESCRIPTION

Figure 1:
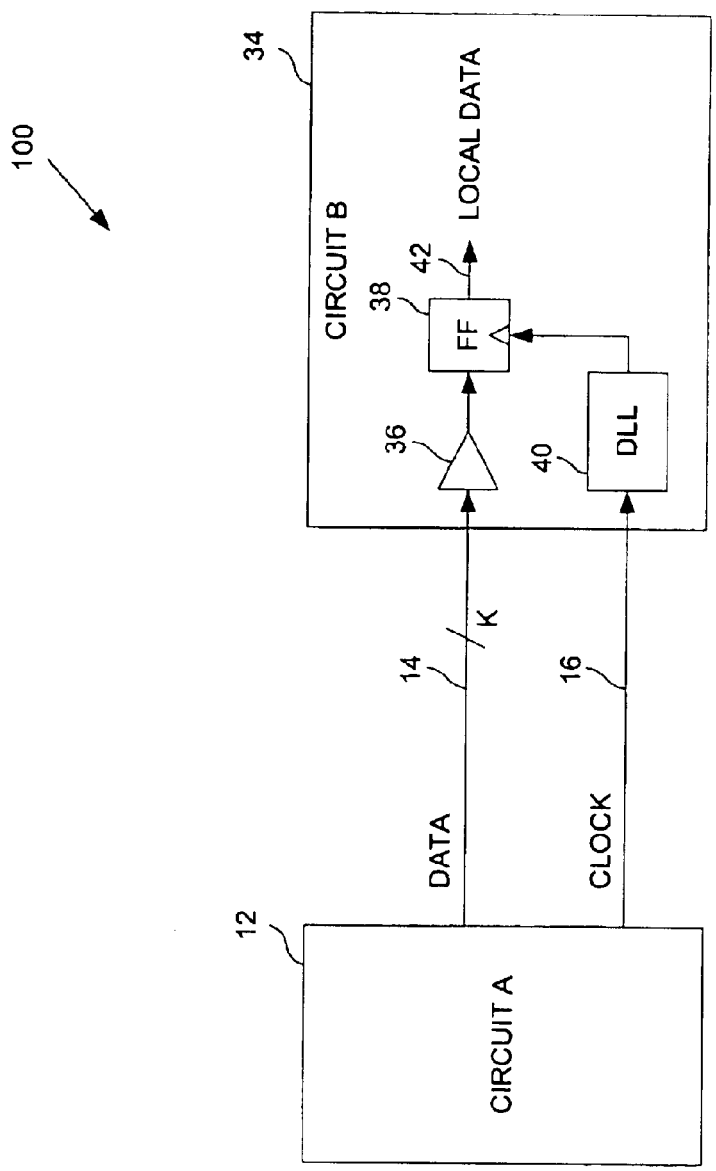
FIG. 1 shows a prior art source synchronous communication system.

Exemplary embodiments of the invention will be described with reference to the accompanying drawings. Like items in the drawings are shown with the same reference numbers.

The present invention relates to a source synchronous communication system in which a phase offset for both a data signal and a signal to latch the data signal is operatively controlled by a delay locked loop. The phase offset for the data signal is delayed by a digital delay line. The delay locked loop in one or more embodiments is a dual loop delay locked loop, in which case, one of the loops may use a low jitter, local clock signal while the other loop uses an input clock signal that was transmitted with the data signal. Controlling both the phase offset of the data signal and the signal to latch the data signal allows the low jitter, local clock signal to be used.

The low jitter, local clock signal provides a stable source from which to derive good clock signal edge transitions for the dual loop delay locked loop. Accordingly, the dual loop delay locked loop uses the local clock signal to generate a low jitter output signal. The input clock signal that was transmitted with the data signal is used by the dual loop delay locked loop to determine the long term clock signal drift. The dual loop delay locked loop may require a consistent pattern in the input clock signal to effect a change in state. Accordingly, the dual loop delay locked loop may be resistant to jitter effects.

The delay locked loop in one or more embodiments includes a finite state machine. The finite state machine maintains the phase offset for both a digital delay line that delays the data signal and a latching device to latch the delayed data signal.

Furthermore, while the dual loop delay locked loop is locking, the finite state machine in the dual loop delay locked loop may randomly change the delay of the digital delay line. Accordingly, the delay of the digital delay line is updated periodically based on a counter or when a low power mode is entered.

Figure 2:
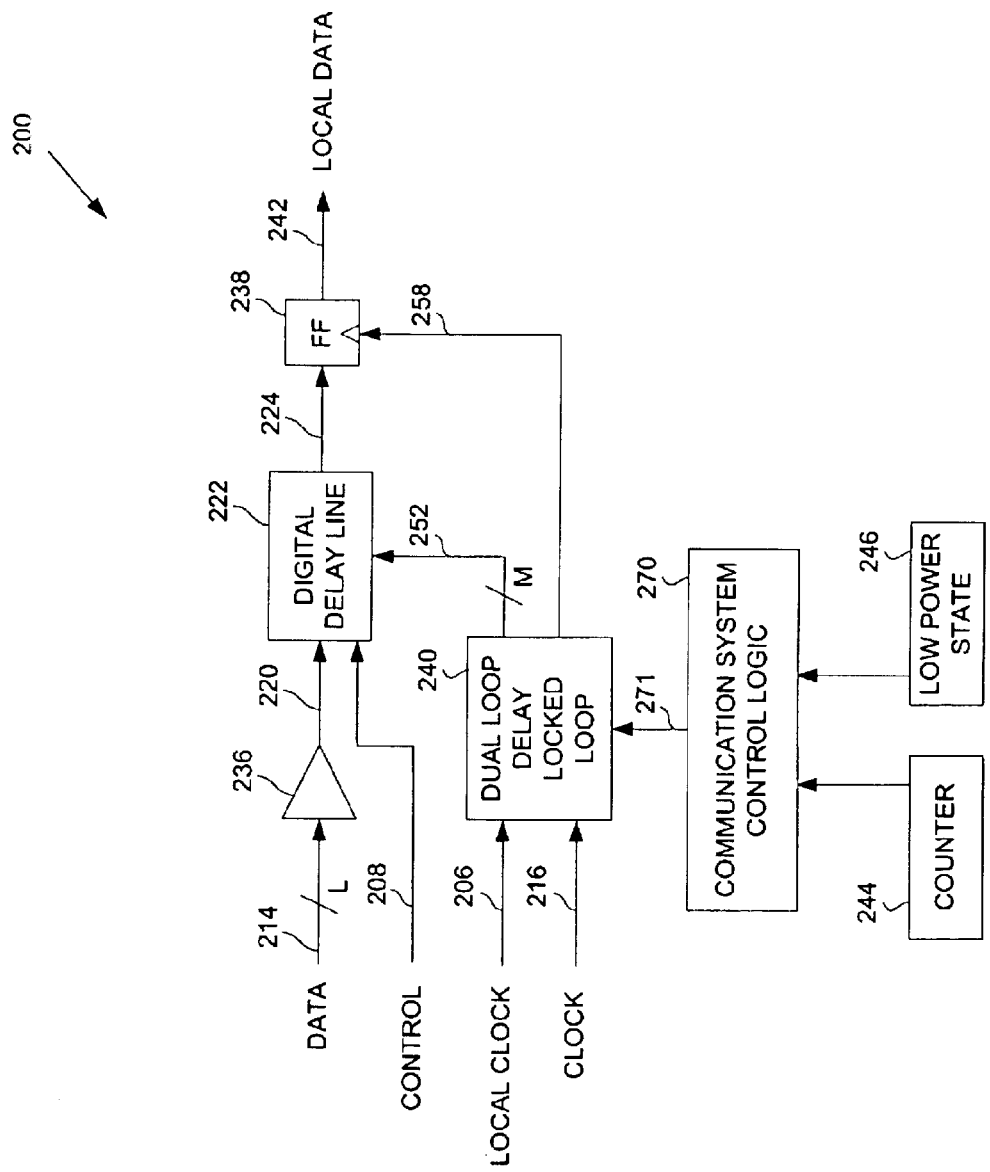
FIG. 2 shows a source synchronous receiver system in accordance with an embodiment of the present invention.

FIG. 2 shows a block diagram of an exemplary source synchronous receiver system (200) in accordance with an embodiment of the present invention. A low jitter, local clock signal (labeled as local clock in FIG. 2) on clock path (206) is used by a dual loop delay locked loop (240) to derive clock signal edges, interpolate clock signals to generate intermediate clock signals, and provide a low jitter clock source. The low jitter, local clock signal on clock path (206) is also used by the dual loop delay locked loop (240) to generate a low jitter output, e.g., a clock signal on a latch device clock path (258). A clock signal (labeled as clock in FIG. 2), transmitted with the data, is also input to the dual loop delay locked loop (240) from clock path (216). The clock signal provides a reference signal so that the dual loop delay locked loop (240) may generate the clock signal having a ninety degree phase offset on a latch device clock path (258) relative to the clock signal on clock path (216). The dual loop delay locked loop (240) also maintains information representative of a zero degree phase offset of the clock signal on clock path (216). The zero degree phase offset is used to operatively control the amount of delay produced by a digital delay line (222).

In FIG. 2, the dual loop delay locked loop (240) generates digital signals on signal paths (252) that are "M" bits wide. The digital signals on the data paths (252) are a zero code that represents a zero degree phase offset. In the exemplary embodiment shown in FIG. 2, the digital delay line (222) receives a control signal (labeled as control in FIG. 2) on signal path (208) to add or subtract a fixed value to the value determined by the digital signals on signal paths (252). The control signal may be generated external to the source synchronous receiver system (200). The control signals may be stored in a memory (not shown).

In FIG. 2, data signals that are "L" bits wide on data path (214) are input to an amplifier (236). The amplifier (236) helps recover the data signals after transmission by increasing the data signals' strength. Amplified data signals on signal path (220) may be delayed by the digital delay line (222) and output on signal path (224). The data signals on the signal path (224) are latched by a latch device, for example, a flip-flop (238). The latched data signal is output as a local data signal on a signal path (242).

The dual loop delay locked loop (240) maintains information to create a zero degree phase offset for the digital delay line (222) and a ninety degree phase offset for the clock signal on the latch device clock path (258). The zero code on the digital signals on signal paths (252) aligns the data signals on signal path (224) to lead the clock signal on the latch device clock path (258) by ninety degrees. While the dual loop delay locked loop (240) is locking, the dual loop delay locked loop (240) may randomly change the delay of the digital delay line (222). Accordingly, the delay of the digital delay line (222) may be held at a known delay during times when the dual loop delay locked loop (240) is updated.

In FIG. 2, a communication system control logic (270) may control the initialization and update of the source synchronous receiver system (200). The communication system control logic (270) may instruct a transmitter to transmit a known set of bits as the data signals on the data path (214). A comparison between the known set of bits and the latched data signal output as the local data signal on the signal path (242) may be used to determine the delay of the digital delay line (222) relative to the phase offset for the clock signal on the latch device clock path (258). The updating may occur periodically based on a counter (244) or when a low power mode is indicated by a low power state (246).

Figure 3:
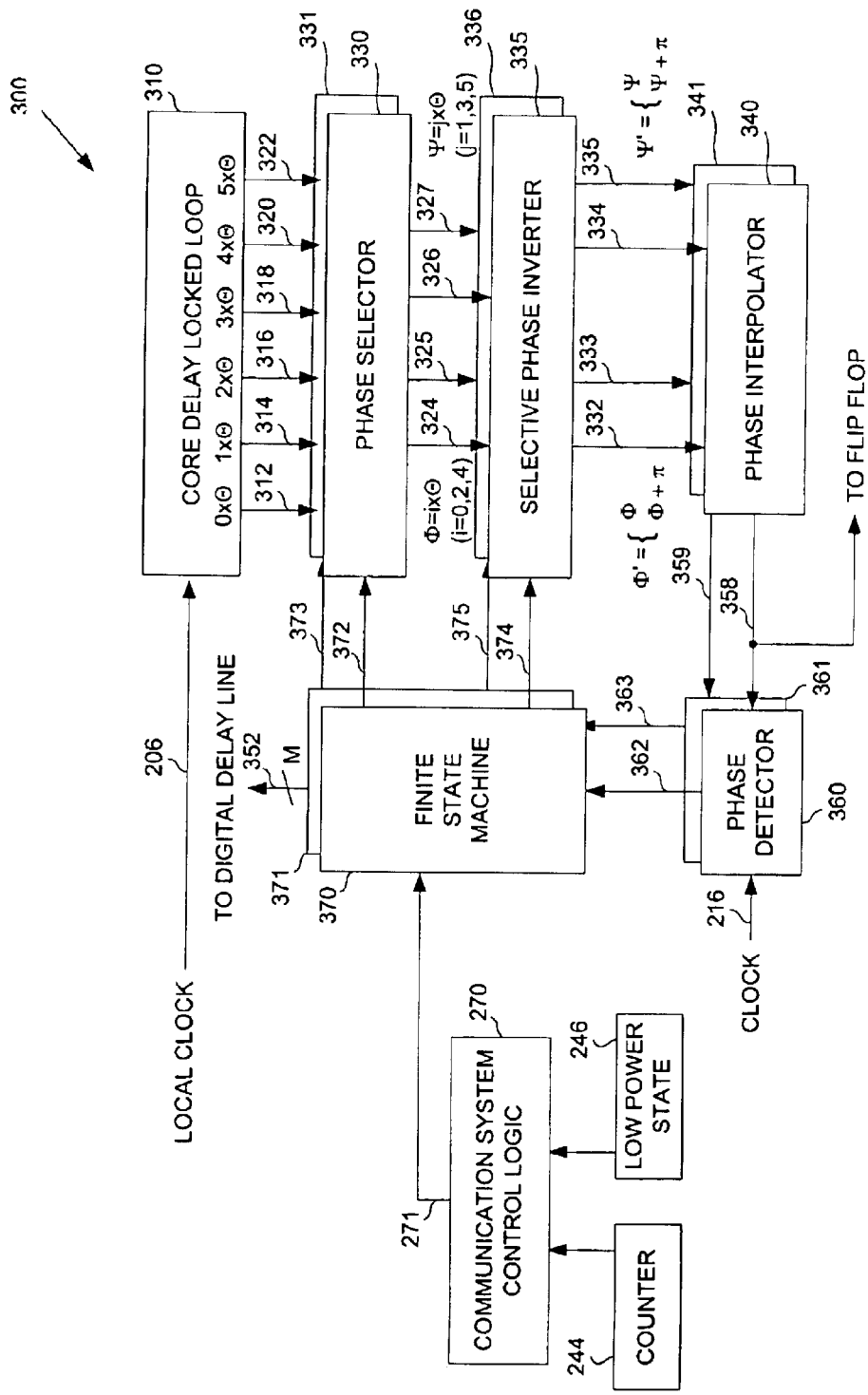
FIG. 3 shows a dual loop delay locked loop and control logic block diagram in accordance with an embodiment of the present invention.

FIG. 3 shows a block diagram of an exemplary dual loop delay locked loop and control logic (300) in accordance with an embodiment of the present invention. The dual loop delay locked loop architecture is based on two cascaded loops: a conventional first-order analog core DLL (310) and a digital peripheral DLL including two finite state machines (370, 371), two phase selectors (330, 331), two selective phase inverters (335, 336), two phase interpolators (340, 341), and two phase detectors (360, 361). The core DLL (310) is locked at a 180 degrees phase offset. Assuming that a delay line of the core DLL (310) comprises six buffers, the outputs of the six buffers are six clocks having phases evenly spaced by 30 degrees. The core DLL (310) has as an input a low jitter, local clock signal on a clock path (206) that is used to create the six delayed outputs. The first output is a zero degree phased output (312) with each subsequent output adding an additional 30 degree phase offset at phased outputs (314, 316, 318, 320, 322), respectively. The low jitter, local clock signal provides good transition edge signals for the core DLL (310) and the two phase selectors (330, 331), the two selective phase inverters (335, 336), the two phase interpolators (340, 341), and the two phase detectors (360, 361) of the digital peripheral DLL.

In FIG. 3, according to one or more embodiments of the present invention, the digital peripheral DLL uses finite state machine (370), phase selector (330), selective phase inverter (335), phase interpolator (340), and phase detector (360) to maintain a ninety degree phase offset for the clock signal on latch device clock path (358) relative to the clock signal on the clock path (216). Furthermore, the digital peripheral DLL uses finite state machine (371), phase selector (331), selective phase inverter (336), phase interpolator (341), and phase detector (361) to maintain a zero code representative of a zero degree phase offset for the clock signal on clock path (359) relative to the clock signal on the clock path (216). Digital signals on a signal path (352) propagate the zero code.

The digital peripheral DLL interpolates between a selected pair of clocks to generate the ninety degree phase offset. Clocks Φ (324) and Ψ (326) are selected from the six phased outputs (312, 314, 316, 318, 320, 322) by the phase selector (330). Clocks Φ (324) and Ψ (326) may be inverted by the selective phase inverter (335) in order to cover the full zero to 360 degree phase range. Clocks Φ' (332) and Ψ' (334) drive digitally controlled phase interpolator (340), which, in turn, generates a clock signal on the latch device clock path (358). The clock signal output from the phase interpolator (340) can be any of N quantized phase steps between the phases of clocks Φ' (332) and Ψ' (334), where 0 . . . N is the interpolation control word range.

The clock signal output from the phase interpolator (340) also drives the phase detector (360) that compares the clock signal output from the phase interpolator (340) and the clock signal on the clock path (216). A phase detector output (362) is used by the finite state machine (370) to control the phase selector (330) and the selective phase inverter (335) through finite state machine control lines (372, 374), respectively. The finite state machine (370) also controls the phase interpolator (340) mixing weight (not shown). The mixing weight determines the interpolated value output from the phase interpolator (340).

The digital peripheral DLL also interpolates between a selected pair of clocks to generate the zero degree phase offset. Clocks Φ (325) and Ψ (327) are selected from the six phased outputs (312, 314, 316, 318, 320, 322) by the phase selector (331). Clocks Φ (325) and Ψ (327) may be inverted by the selective phase inverter (336) in order to cover the full zero to 360 degree phase range. Clocks Φ' (333) and Ψ' (335) drive a digitally controlled phase interpolator (341). The clock signal output from the phase interpolator (341) can be any of S quantized phase steps between the phases of clocks Φ' (331) and Ψ' (335), where 0 . . . S is the interpolation control word range.

The clock signal output from the phase interpolator (341) drives the phase detector (361) that compares the clock signal output on a clock path (359) from the phase interpolator (341) and the clock signal on the clock path (216). A phase detector output (363) is used by the finite state machine (371) to control the phase selector (331) and the selective phase inverter (336) through finite state machine control lines (373, 375), respectively. The finite state machine (371) also controls the phase interpolator (341) mixing weight (not shown). The mixing weight determines the interpolated value output from the phase interpolator (341).

The finite state machines (370, 371) adjust the phase of the phase interpolators (340, 341) according to the phase detector output (362, 363), respectively. Generally, this requires changing the phase interpolators (340, 341) mixing weight by one. If, however, the phase interpolators (340, 341) controlling word has reached its minimum or maximum limit, the finite state machines (370, 371) must change the phase of Φ (324) or Ψ (326), or Φ (325) or Ψ (327), to the next appropriate selection. This phase selection change might also involve an inversion of the corresponding clock signal if the current interpolation interval is adjacent to the zero degree or 180 degree boundary. Because phase selection changes happen only when the corresponding phase mixing weight is zero, no glitches occur on the clock signal on the latch device clock path (358) or the digital signals on the signal path (352). The digital "bang—bang" nature of the control results in dithering around the zero phase error point in the lock condition. The dither amplitude is determined by the phase interpolators (340, 341) and the delay through the peripheral DLL.

Use of the low jitter, local clock signal on signal path (206) allows the dual loop delay locked loop (300) to have low jitter on the latch device clock path (358). The clock signal on the clock path (216) is used to update the long term drift of the dual loop delay locked loop (300). A consistent pattern for the clock signal on the clock path (216) may be required before the two finite state machines (370, 371) adjust the two phase selectors (330, 331), two selective phase inverters (335, 336), or two phase interpolators (340, 341). Jitter on the clock signal on the clock path (216) may not induce jitter on the latch device clock path (358) or the digital signals on the signal path (352).

In the above described architecture, the phase of the clock signal on the latch device clock path (358) output from phase interpolator (340) and the digital signals on the signal path (352) can be rotated. No hard limits exist in the loop phase capture range, i.e., the loop provides unlimited (modulo 2π) phase offset capability. This property eliminates boundary conditions and phase relationship constraints. The only requirement is that the clock signals to the core DLL (310) and the two phase detectors (360, 361) are plesiochronous (i.e., their frequency difference is bounded), making this architecture suitable for clock recovery applications. In FIG. 3, the local clock signal on the clock path (206) and the clock signal on the clock path (216) are at the same frequency; therefore, the plesiochronous constraint is met.

In FIG. 3, the finite state machine (370) maintains a ninety degree phase offset for the clock signal on the latch device clock path (358) relative to the clock signal on the clock path (216). Also, the finite state machine (371) maintains a zero code representative of a zero degree phase offset for the digital signals on the signal path (352) relative to the clock signal on the clock path (216). In one or more embodiments, jitter in the clock signal on the clock path (216) will not be immediately transferred to the clock signal on the latch device clock path (358) or for the digital signals on the signal path (352). Those skilled in the art will understand that the core DLL (310), two phase selector (330, 331), two selective phase inverters (335, 336), and two phase interpolators (340, 341) form a delay element. Furthermore, in one or more embodiments, the two finite state machines (370, 371) may not update the phase offset generated by the two phase selector (330, 331), two selective phase inverter (335, 336), and two phase interpolator (340, 341) until a repeated pattern is observed in the clock signal on the clock path (216).

In FIG. 3, according to one or more embodiments of the present invention, the finite state machine (371) maintains information as to the zero degree phase offset of the clock signal on the clock path (216). The zero phase offset may indicate the beginning of the time that valid data arrives on the data path (214) in FIG. 2. Digital signals on the signal path (352) that are "M" bits wide are generated from the finite state machine (371) to operatively control a digital delay line, for example, the digital delay line (222) shown in FIG. 2. The digital signals on the signal path (352) are representative of a zero code.

In FIG. 3, the dual loop delay locked loop (300) maintains information to create a zero degree phase offset and a ninety degree phase offset for the clock signal on the latch device clock path (358). While the dual loop delay locked loop (300) is locking, the dual loop delay locked loop (300) may randomly change the delay of the digital delay line (222 in FIG. 2). Accordingly, the delay of the digital delay line (222 in FIG. 2) may be held at a known delay by the finite state machine (371) in response to a communication system control logic (270) during times when the dual loop delay locked loop (300) is updated.

In FIG. 3, a communication system control logic (270) may control the initialization and update of the source synchronous receiver system (200 in FIG. 2). The communication system control logic (270) may instruct a transmitter to transmit a known set of bits as the data signals on the data path (214 in FIG. 2). A comparison between the known set of bits and the latched data signal output as the local data signal on the signal path (242 in FIG. 2) may be used to determine the delay of the digital delay line (222 in FIG. 2) relative to the phase offset for the clock signal on the latch device clock path (358). The communication system control logic (270) may operatively control the two finite state machine (370, 371) to test and determine an appropriate delay for the digital delay line (222 in FIG. 2). The updating may occur periodically based on a counter (244) or when a low power mode is indicated by a low power state (246).

Figure 4:
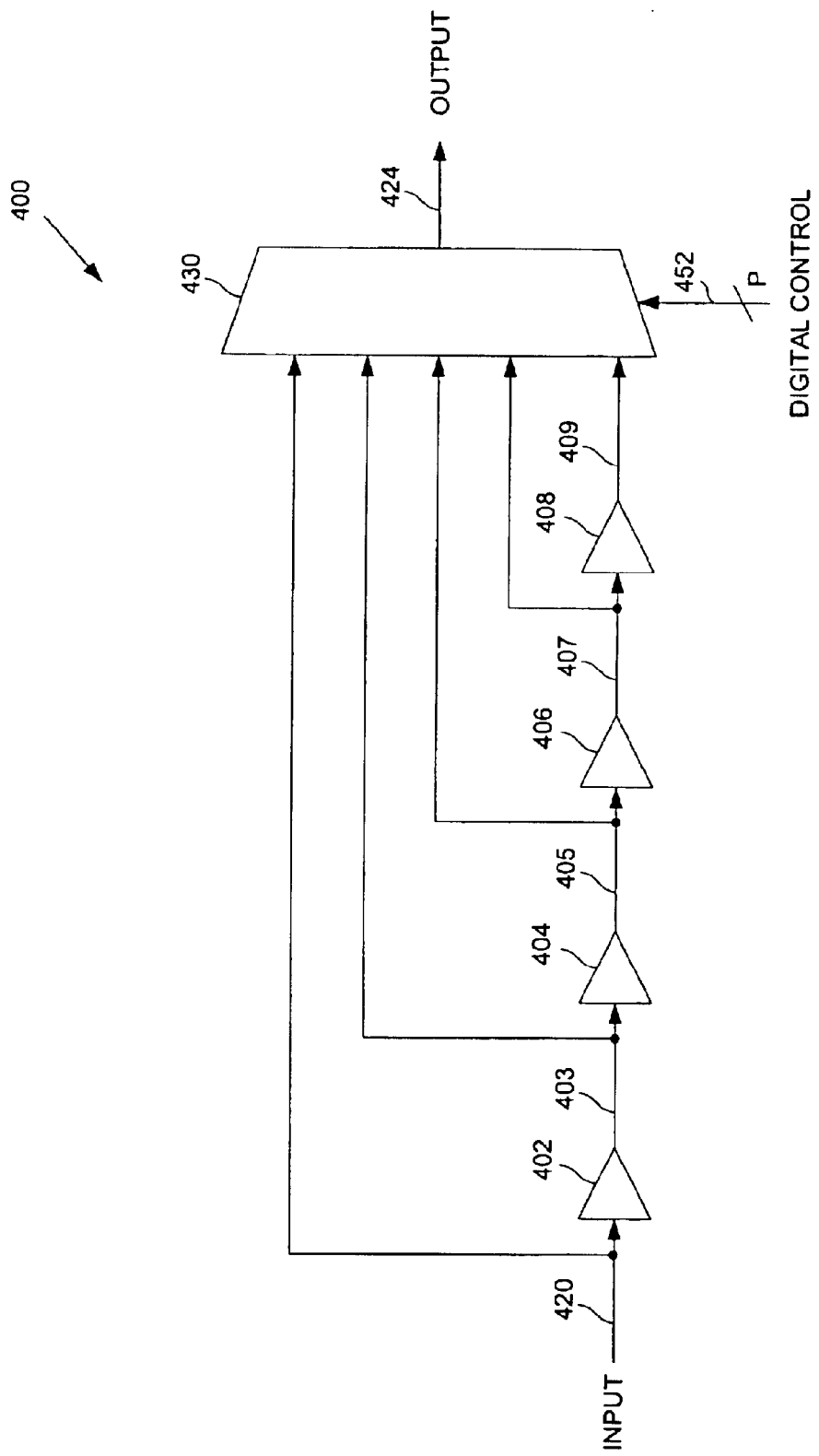
FIG. 4 shows a digital delay line block diagram in accordance with an embodiment of the present invention.

FIG. 4 shows a block diagram of an exemplary digital delay line (400) in accordance with an embodiment of the present invention. The digital delay line (400) includes a plurality of delay elements (402, 404, 406, 408) and a multiplexer (430). The plurality of delay elements (402, 404, 406, 408) form a delay chain for an input signal (420). The input signal (420) is input to a first delay element (402). The first delay element output (403) of the first delay element (402) is input to a second delay element (404). The second delay element output (405) of the second delay element (404) is input to a third delay element (406). An output of each successive delay element is input to the next delay element in the delay chain.

In FIG. 4, each delay element (402, 404, 406, 408) in the delay chain increases the delay added to the input signal (420). The input signal (420) and the delay element output (403, 405, 407, 409) from each delay element (402, 404, 406, 408) are input to the multiplexer (430). Digital control signals that are "P" bits wide on signal path (452) are input to the multiplexer (430). In response to the digital control signals, the multiplexer (430) outputs one of the inputs to the multiplexer (430). The digital delay line (400) generates a delay for the input signal (420) at the output signal (424) selected from a plurality of delays produced by the delay chain.

Advantages of the present invention may include one or more of the following. In one or more embodiments, the timing of a data signal's arrival at a latch device is controlled in addition to the timing of the latch device's latching of the data signal. Advantageously, the difference between these two times may controlled.

In one or more embodiments, a dual loop delay locked loop is used. The dual loop delay locked loop uses a finite state machine. The finite state machine may be programmed to update a phase offset only after a repeated pattern is observed in the input clock signal. Accordingly, jitter in the clock signal may have a reduced effect. Furthermore, the finite state machine creates a ninety degree phase offset for a clock signal on a latch device clock path and maintains information of a zero degree phase offset operatively used to control a digital delay line to delay a data signal.

In one or more embodiments, a low jitter, local clock signal is supplied to a dual loop delay locked loop. The dual loop delay locked loop may generate a low jitter clock signal on a latch device clock path. A clock signal transmitted with the data may be used to update the long term drift of the dual loop delay locked loop. The dual loop delay locked loop acts as a filter to prevent a large amount of jitter from the clock signal transmitted with the data from adding noise to a source synchronous receiver system.

In one or more embodiments, a dual loop delay locked loop may randomly change a zero phase offset indicator while the dual loop delay locked loop is locking. The dual loop delay locked loop uses a finite state machine. Accordingly, the finite state machine's zero phase offset indicator may be held at a known state during times when the dual loop delay locked loop (240) is updated. The dual loop delay locked loop may be updated periodically based on a counter or when a low power mode is entered.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A source synchronous interface, comprising:
   a first clock path arranged to carry a clock signal;
   a second clock path arranged to carry a local clock signal;
   a data path arranged to carry a data signal;
   a digital delay line arranged to delay the data signal to produce a delayed data signal; and
   a delay locked loop arranged to operatively control the delay of the digital delay line, wherein control of the delay is concurrently responsive to changes on the local clock signal and the clock signal.

2. The source synchronous interface of claim 1, wherein an output of the digital delay line is adjusted by a control signal.

3. The source synchronous interface of claim 1, further comprising:
   a latch device arranged to latch the delayed data signal, wherein the latch device is responsive to the delay locked loop.

4. The source synchronous interface of claim 3, wherein the delay locked loop is a dual loop delay locked loop.

5. The source synchronous interface of claim 4, wherein the dual loop delay locked loop comprises a finite state machine.

6. The source synchronous interface of claim 5, wherein the finite state machine operatively controls the delay of the digital delay line.

7. The source synchronous interface of claim 5, wherein the finite state machine indicates a zero degree phase offset.

8. The source synchronous interface of claim 4, wherein the latch device is operatively controlled by a ninety degree phase offset from the dual loop delay locked loop.

9. The source synchronous interface of claim 4, wherein the dual loop delay locked loop is operatively updated as determined by a counter.

10. The source synchronous interface of claim 4, wherein the dual loop delay locked loop is operatively updated during a low power mode.

11. The source synchronous interface of claim 4, wherein the dual loop delay locked loop comprises a core delay locked loop, a phase interpolator, and a phase detector, wherein the clock signal is operatively connected to the phase detector, wherein the local clock signal is operatively connected to the core delay locked loop, and wherein the phase interpolator is operatively connected to the latch device.

12. The source synchronous interface of claim 11, wherein the core delay locked loop provides at least 180 degrees of phase offset.

13. A method for performing source synchronous interface operations, comprising:
   transmitting a clock signal;
   transmitting a local clock signal;
   transmitting a data signal;
   delaying the data signal using a digital delay line to produce a delayed data signal; and
   controlling the delaying, wherein controlling the delaying is concurrently responsive to changes on the local clock signal and the clock signal.

14. The method of claim 13, further comprising:
   latching the delayed data signal, wherein the latching is responsive to a delay locked loop.

15. The method of claim 14, wherein the delay locked loop is a dual loop delay locked loop.

16. The method of claim 15, wherein the dual loop delay locked loop comprises a finite state machine.

17. The method of claim 16, the method comprising indicating a zero degree phase offset by the finite state machine.

18. The method of claim 16, the method comprising indicating a ninety degree phase offset by the finite state machine.

19. The method of claim 16, wherein the finite state machine operatively controls the delaying.

20. The method of claim 15, wherein the dual loop delay locked loop comprises a core delay locked loop, a phase interpolator, and a phase detector, wherein the latching is responsive to the phase interpolator, wherein the phase detector is responsive to the clock signal, and wherein the core delay locked loop is responsive the local clock signal.

21. The method of claim 20, wherein the core delay locked loop provides at least 180 degrees of phase offset.

22. The method of claim 14, the method comprising updating the delay locked loop determined by a counter.

23. The method of claim 14, the method comprising updating the delay locked loop during a low power mode.

24. A source synchronous interface, comprising:
means for transmitting a clock signal;
means for transmitting a local clock signal;
means for transmitting a data signal;
means for delaying the data signal to produce a delayed data signal;
means for controlling the delaying, wherein the means for controlling the delaying is concurrently responsive to changes on the local clock signal and the clock signal; and
means for periodically updating the means for delaying.

25. The source synchronous interface of claim 24, further comprising:
means for latching the delayed data signal.

* * * * *